United States Patent [19]

Mahler et al.

[11] Patent Number: 5,468,362

[45] Date of Patent: Nov. 21, 1995

[54] APPARATUS FOR TREATING SUBSTRATES IN A VACUUM CHAMBER

[75] Inventors: Peter Mahler, Hainburg; Wolfgang Stang, Kefenrod, both of Germany

[73] Assignee: Leybold Aktiengesellschaft, Hanau, Germany

[21] Appl. No.: 185,095

[22] Filed: Jan. 21, 1994

[30] Foreign Application Priority Data

Apr. 13, 1993 [DE] Germany .......................... 43 12 014.8

[51] Int. Cl.$^6$ .................................................. C23C 14/34
[52] U.S. Cl. ..................... 204/298.11; 118/720; 118/721; 156/345; 204/298.28
[58] Field of Search ........................ 204/298.11, 298.23, 204/298.24, 298.25, 298.28; 156/345; 118/720–721

[56] References Cited

U.S. PATENT DOCUMENTS

| | | | |
|---|---|---|---|
| 4,278,528 | 7/1981 | Kuehnle et al. | 204/298.11 |
| 4,422,896 | 12/1983 | Class et al. | 156/643 |
| 4,525,262 | 6/1985 | Class et al. | 204/192.12 |
| 4,572,842 | 2/1986 | Dietrich et al. | 427/571 |
| 4,595,483 | 6/1986 | Mahler | 204/298.04 |
| 5,223,112 | 6/1993 | Tepman | 204/298.11 |

FOREIGN PATENT DOCUMENTS

| | | |
|---|---|---|
| 91404 | 7/1972 | German Dem. Rep. . |
| 225451 | 7/1985 | German Dem. Rep. . |
| 3807894 | 2/1989 | Germany . |

*Primary Examiner*—Aaron Weisstuch
*Attorney, Agent, or Firm*—Felfe & Lynch

[57] ABSTRACT

A vacuum chamber houses a rotatable substrate holder next to a door having a cathode target mounted therein. A plate-like mask is movable to a position between the substrate holder and the door so that the target can be cleaned without contaminating the substrate. The mask is preferably moved by a screw jack including a tube driven through a sealed hole in the chamber wall.

12 Claims, 6 Drawing Sheets

APPARATUS FOR TREATING SUBSTRATES IN A VACUUM CHAMBER

BACKGROUND OF THE INVENTION

The invention relates to an apparatus for coating and/or etching substrates in a vacuum chamber, having a coating source, for example a cathode bearing a target, and having a substrate holder which can be moved with respect to the coating source, plus a power supply and a plate or mask which can be moved within the space between the source and the substrate.

U.S. Pat. No. 4,422,896 describes an apparatus in which the substrates are disposed on a polygonal body which is mounted on the cover of the vacuum chamber. The substrates can be fastened on the substrate holder or removed therefrom only with difficulty.

DD 225 451 discloses a positioning gear for the angular etching of substrates, especially semiconductor wafers, which is disposed in a vacuum chamber of a dry etching apparatus and is joined to a substrate plate bearing the substrates. The positioning gear moves the substrate plate, which is integral with a substrate holder, to an etching position within the high vacuum of 0 degrees to 90 degrees. The substrate holder successively assumes air-locking positions and working positions in a linear direction of movement. The pivoting substrate plate is mounted on a pivot axis on the part of the substrate holder that is not adjustable for the etching angle. A plate is disposed at right angles to the pivot axis of the substrate plate and contains a cam track. An element for the transmission of a rotating movement is fixed to the pivot shaft, and drives an additional transfer means rotatably disposed on the part of the substrate holder that is not adjustable for etching angle, and it has at a distance from its axis of rotation a means which engages the cam track of the plate. The cam track is configured so that when the substrate holder moves in range of the etching position the substrate plate is rotated at an angle of 0 degrees and 90 degrees to the ion source axis, the center of the substrate surface always retaining its position in the ion beam in a great number of different etching positions. This known apparatus has the disadvantage of being extraordinarily complicated in construction and therefore very liable to give trouble. U.S. application Ser. No. 08/160,923 (DE 43 05 740) discloses an apparatus for the coating and/or etching of substrates, in which the substrate holder is so disposed within the vacuum chamber and the substrate holder is so configured that the actual treatment process can take place with the substrate surfaces upright. The danger of loss of quality of the coated surfaces due to particles of glitter falling onto the substrates is thereby prevented, the cathode and anode arrangement is easy to maintain, and the replacement of targets can be performed effortlessly.

For this purpose the substrate holder is in the form of a substantially cylindrical hollow body whose circular end face is provided with a journal pin which is held for rotation about a horizontal axis in a bearing disposed on the side wall of the vacuum chamber. Holders for clamping the substrates are provided on the circumferential surface of the hollow body and at least partially overlap the cylindrical outer surface. The cathode and/or the etching anode are disposed opposite the substrate holder in a plane running horizontally and in the plane of the axis of rotation of the substrate holder.

U.S. Pat. No. 4,595,483 discloses a cathode sputtering apparatus with a successive series of stations including a loading station, an etching station, and a coating station. A substrate carrier which can move back and forth between the stations is fastened by a boom eccentrically on a rotary bearing brought through the vacuum chamber. This known apparatus cools the substrates on their way through the individual stations, but it also has a special circular disk that serves as a preliminary sputtering plate onto which the impurities from the surface of the sputtering cathode deposit themselves at the beginning of the coating process.

SUMMARY OF THE INVENTION

The present invention provides easy loading of the substrate carrier and an especially glitter-free process. The source is disposed on the inside of the chamber door and the plate or mask can be moved by a lifting means from a rest position outside of the action or reaction range in a plane parallel to the plane of the substrates, into a position in which the mask covers the substrates and the source acts exclusively on the mask.

DETAILED DESCRIPTION OF THE PREFERRED EMBODIMENT

Figure 1:
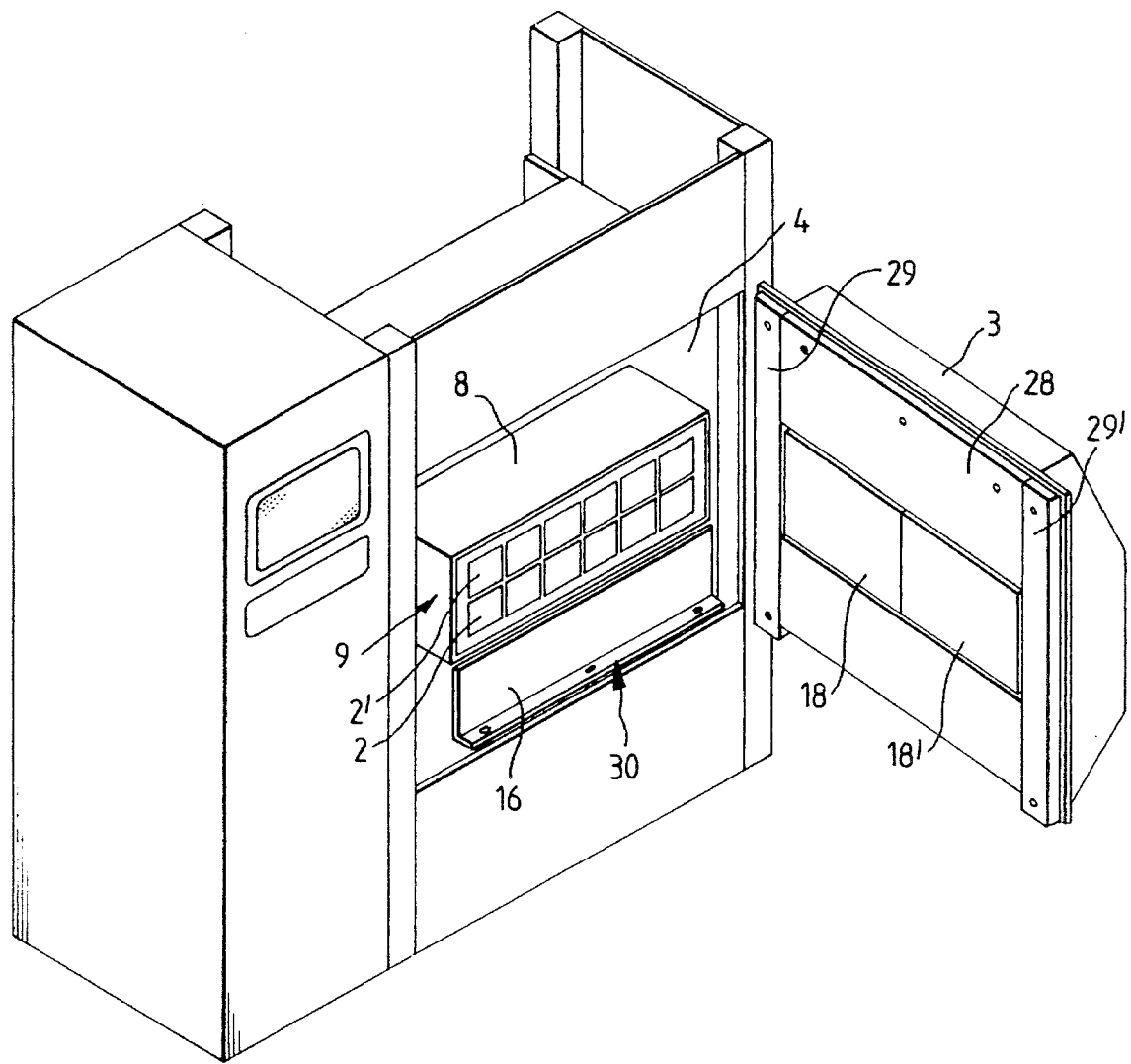
FIG. 1 is a perspective view of the apparatus with the chamber door open and the mask or preliminary cleaning plate lowered.
Figure 2:
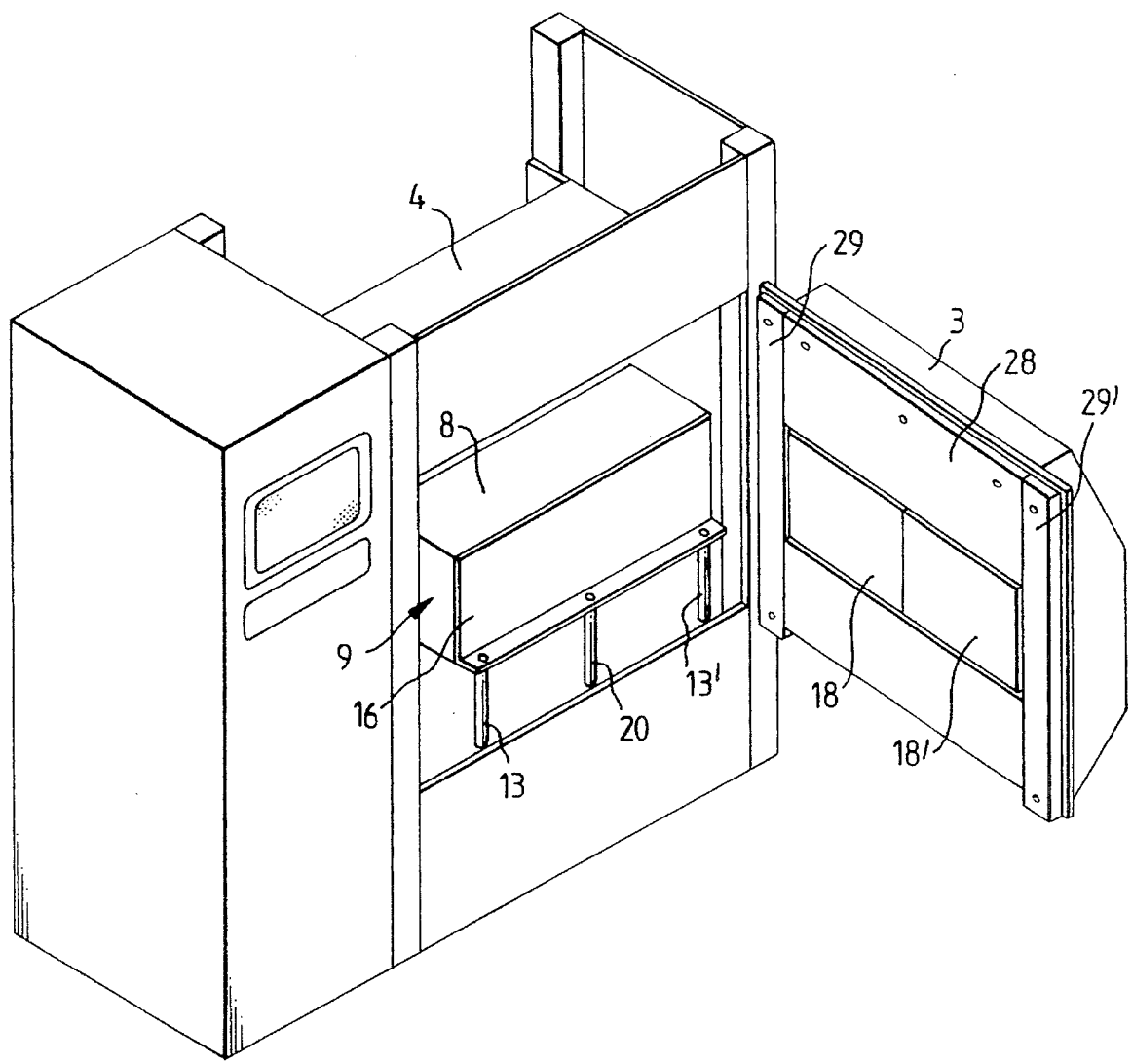
FIG. 2 is a perspective view of the apparatus with a mask placed in front of the substrate holder.

The apparatus for coating substrates includes a vacuum chamber 4 closable by a door 3; a back wall 5 of the chamber provided with opening 6 to which the suction connections of vacuum pumps 7 are attached; and a drum-like substrate holder 8 forming a prismatic hollow body whose two end walls 9 are provided with journal pins 10 and 10' resting in bearing bores in the side walls 12 and 12'. The journal pin 10 projecting outward through the one side wall 12 of the vacuum chamber is driven by a motor unit (not shown).

Inasmuch as the substrate holder 8 is in the form of a prismatic hollow body whose interior communicates with the space surrounding the apparatus only through a longitudinal bore 11 in the journal 10, the power lines of a matching network (not shown) can be attached directly to the substrate holder and to the substrates 2,2' mounted thereon, so that (after a process gas is admitted into the vacuum chamber 4) an etching process can be performed.

Figure 5:
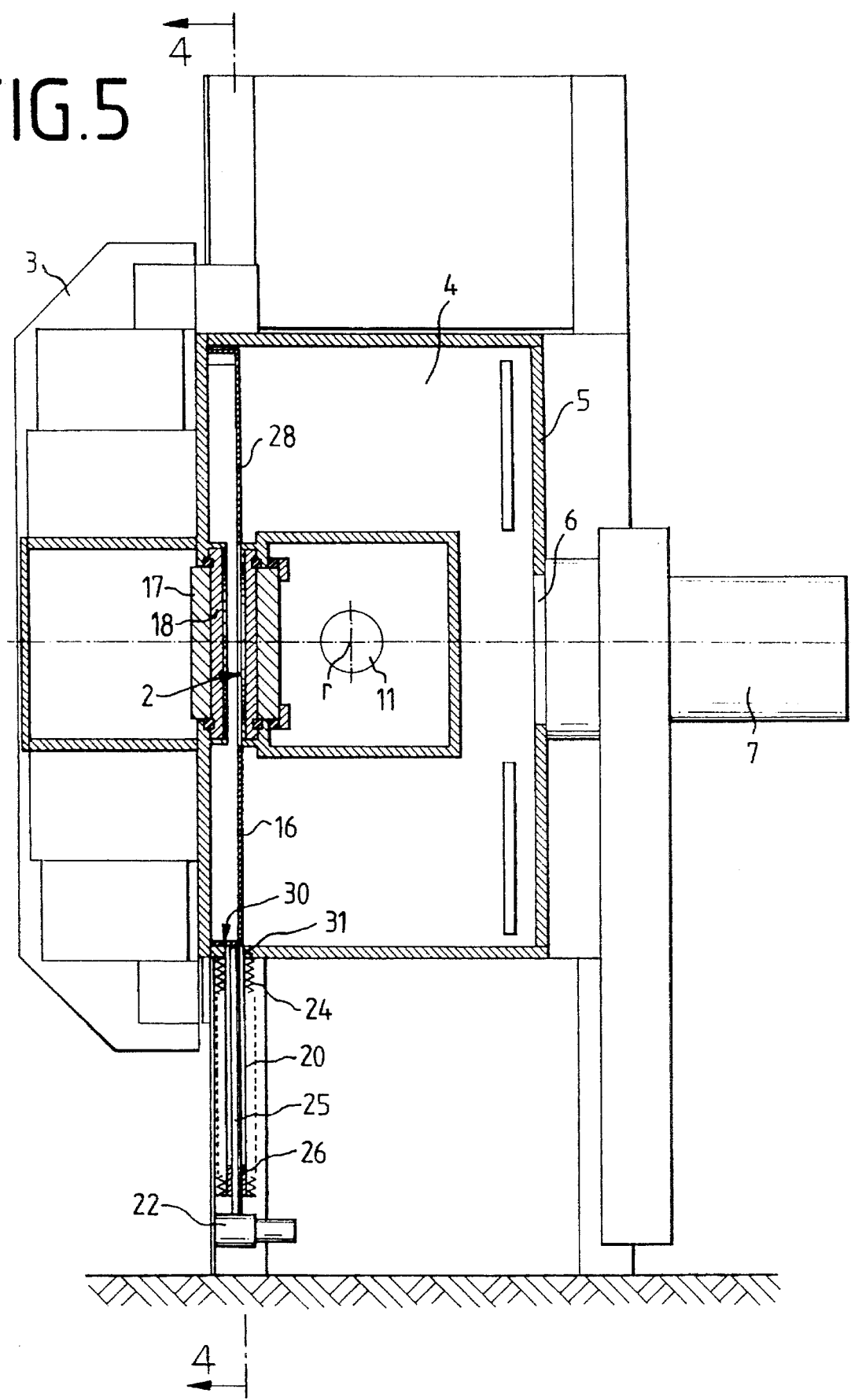
FIG. 5 is an end section view as in FIG. 3, but with the mask lowered.

When the substrate holder 8 is in the position shown in FIG. 5, the cathodes 17 with their targets 18 are directly opposite the respective substrates 2 so that a sputter coating process can be performed.

The horizontal arrangement of the substrate holder 8 and axis of rotation r effectively prevent any glitter that might form in the surroundings of the substrates 2 and cathodes 17 from getting onto the substrates, thus impairing the quality of the sputtered coating.

It is obvious that by means of a drive unit the substrate holder 8 can be rotated to any desired position, so that loading or removing substrates can be performed quite effortlessly and in any position.

Figure 3:
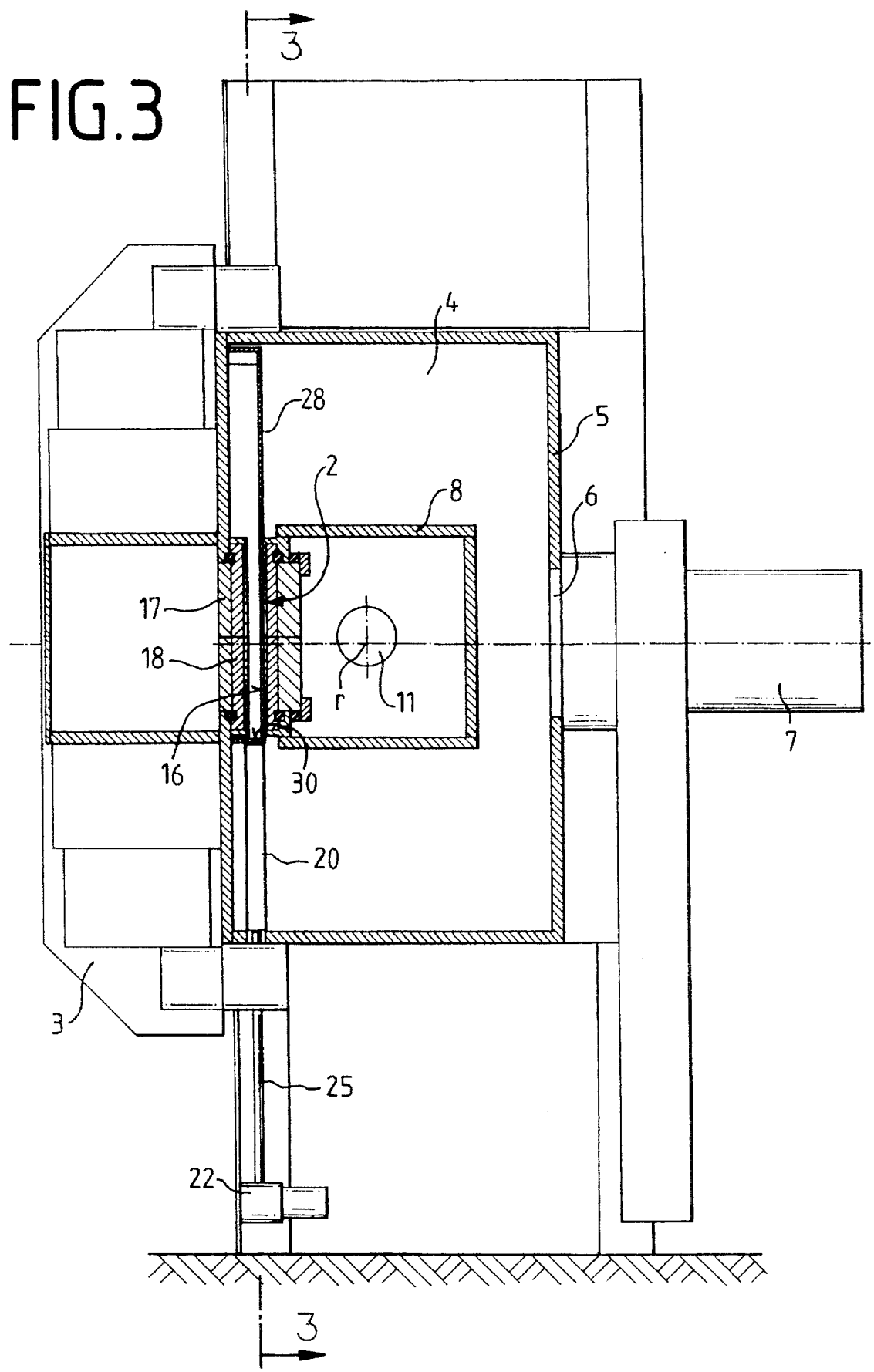
FIG. 3 is an end section view of the apparatus with the processing chamber door closed and the mask raised.

As shown in FIG. 1, a flat, rectangular plate or mask 16 is situated immediately in front of the substrate holder 8 and the substrates 2. The mask 16 can be moved vertically by means of a jack 20 (FIG. 4), and for that purpose it is held by guiding rods 13 slidably mounted in sleeves 23 in the bottom part of the apparatus. The door 3 includes an upper rectangular panel 28 and two lateral panels 29, 29'. The mask 16 moves vertically between panels 29, 29' until it is received flushly against panel 28. As shown in FIG. 3, a lower flange 30 fixed to the mask 16 provides a shield below the targets 18, 18' when the mask 16 is in the uppermost position.

Figure 4:
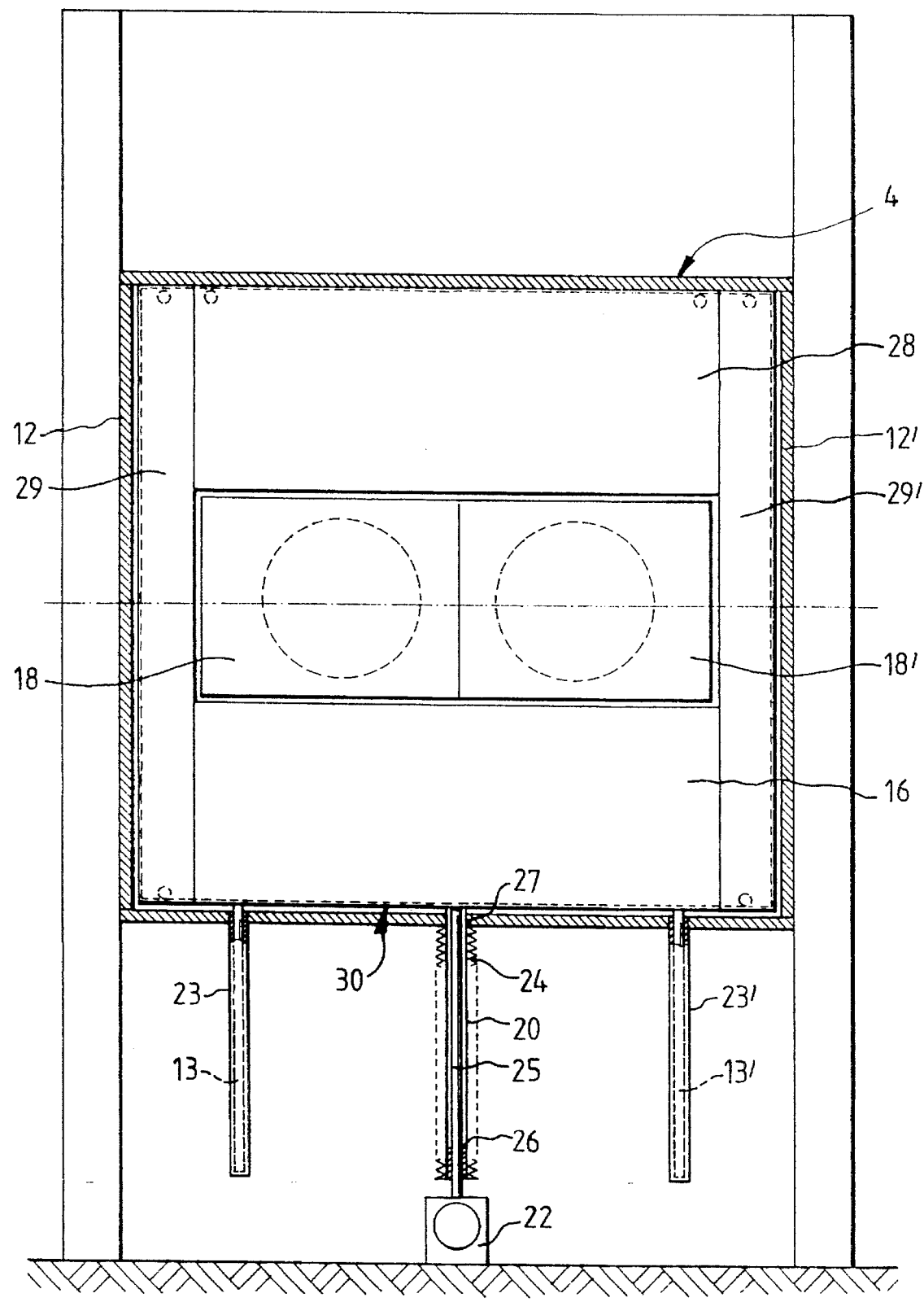
FIG. 4 is a transverse section view taken through the processing chamber parallel to the plane of the mask raising device, corresponding to lines 4—4 in FIG. 5.
Figure 6:
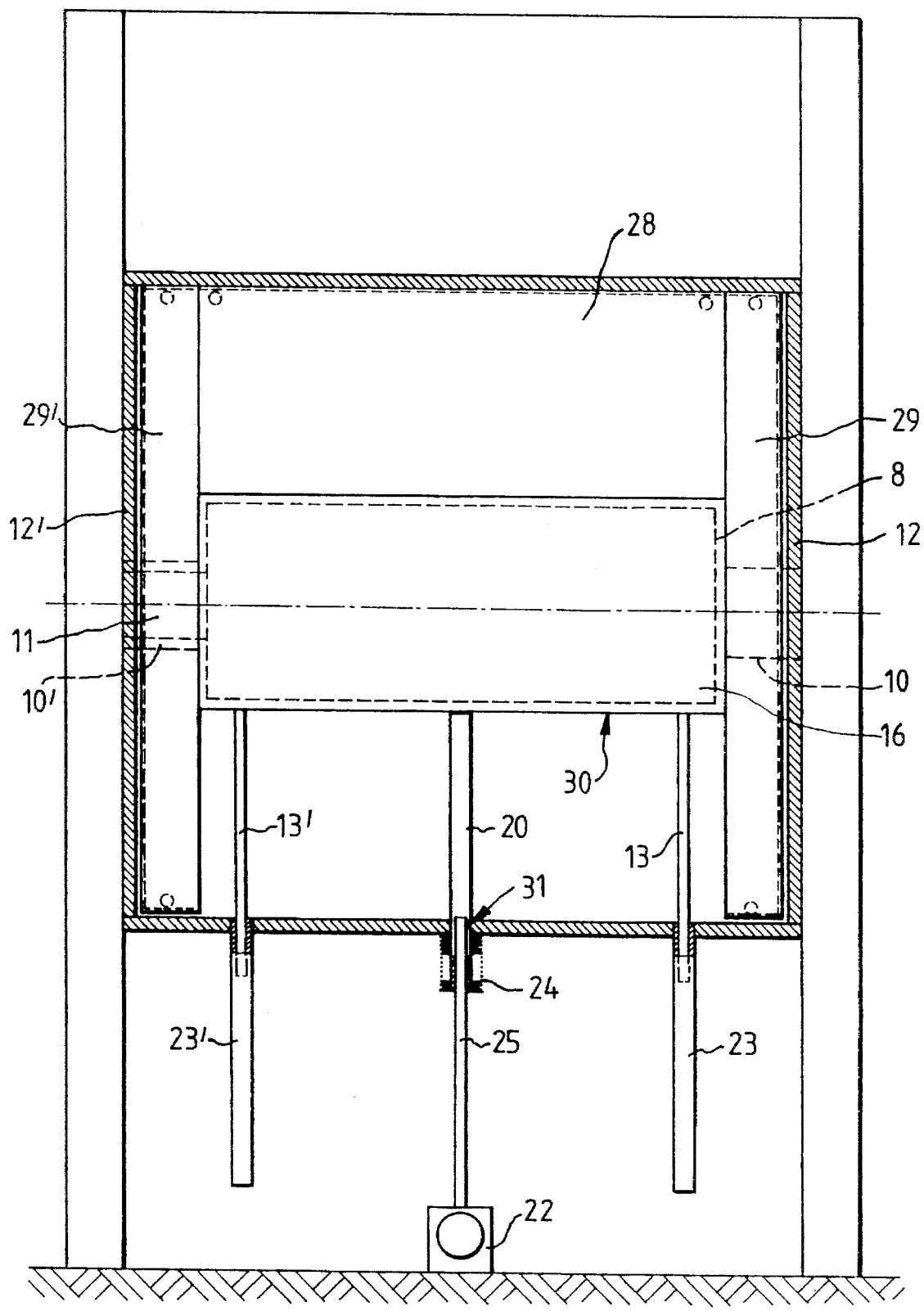
FIG. 6 is a front elevation and section of the processing chamber, with the preliminary cleaning plate (corresponding to lines 3—3 in FIG. 3).

Referring to FIG. 4, the jack 20 is provided with a threaded bore 26 which receives a threaded rod 25 driven by a motor unit 22. The jack 20 is sealed by means of a bellows 24 so that the jack 20 passes hermetically through an opening 31 in the bottom of the vacuum chamber 4. The plate or mask 16 is also affixed at its narrow bottom part to the guide rods 13, 13' which are guided in corresponding sleeves 23, 23' sealed shut at their bottom ends. In FIG. 6 the guide rods 13, 13' and the jack 20 are shown in their extended positions wherein the plate 16 is raised by the jack to its upper position in which it covers the substrates 2 and thus prevents contamination of the substrates. This permits the target surfaces 18 to be cleaned, e.g., by first sputtering onto the plate 16 with the chamber door 3 closed and the process chamber 4 evacuated.

In an alternative embodiment the mask is guided in the manner of a guillotine in vertical grooves or on rails disposed on opposite sides of the substrate holder, and driven by a cable or chain hoists on this upper part of the vacuum chamber.

We claim:

1. Apparatus for treating substrates, said apparatus comprising a chamber having an opening therein, means for holding a plurality of substrates in a plane adjacent to said opening, door means for closing said opening, source means fixed to said door for treating said substrates, a plate-like mask in said chamber, said mask being movable in a plane parallel to said plane in which said substrates are held, means for moving said plate-like mask into a position between said source means and said means for holding said substrates, and, panel means cooperable with said mask to shield said means for holding said substrates from said source means when said plate-like mask is in said position between said source means and said means for holding said substrates.

2. Apparatus as in claim 1 wherein said means for moving said plate-like mask comprises tube means having a blind end fixed to said mask, said tube means having internal threads, bore means in said chamber for receiving said tube means slidably therethrough, a threaded rod received in said tube means, and drive means mounted to said frame for rotating said rod, thereby driving said tube means through said bore.

3. Apparatus as in claim 2 further comprising a guide rod fixed to said mask parallel to said tube means, and a sleeve fixed to said chamber parallel to said threaded rod, said sleeve receiving said guide rod slidably therein.

4. Apparatus as in claim 1 wherein said panel means comprises a top panel and a pair of parallel lateral panels, said plate-like mask being movable between said lateral panels and fitting flushly against said top panel when said mask is in said position.

5. Apparatus as in claim 4 wherein said top panel and said lateral panels are fixed to said door.

6. Apparatus as in claim 4 wherein said top panel, said lateral panels, and said plate-like mask are arranged in a vertical plane.

7. Apparatus as in claim 4 wherein said shield means comprises a flange fixed to said mask opposite from said top panel.

8. Apparatus as in claim 4 wherein said source means comprises magnetron cathode means including planar target means mounted in a vertical plane.

9. Apparatus as in claim 1 wherein said door is mounted to said chamber by vertical hinge means.

10. Apparatus as in claim 1 wherein said means for holding substrates holds said substrates in a coplanar array in plane parallel to said opening.

11. Apparatus as in claim 1 wherein said means for holding a plurality of substrates comprises a drum rotatable about an axis.

12. Apparatus as in claim 11 wherein said axis is a horizontal axis.

* * * * *